United States Patent
Hall et al.

(10) Patent No.: US 6,788,227 B2
(45) Date of Patent: Sep. 7, 2004

(54) APPARATUS FOR INTEGRATED CASCADE ENCODING

(75) Inventors: Barbara A. Hall, Endwell, NY (US);
Agnes Y. Ngai, Endwell, NY (US);
Michael P. Vachon, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 10/114,012

(22) Filed: Mar. 28, 2002

(65) Prior Publication Data

US 2003/0184453 A1 Oct. 2, 2003

(51) Int. Cl.$^7$ ............................. H03M 7/38; H04N 7/36
(52) U.S. Cl. ........................ 341/51; 341/50; 375/240.14
(58) Field of Search ........................ 341/50, 51, 65, 341/67; 714/704; 358/426.03; 375/240.14

(56) References Cited

U.S. PATENT DOCUMENTS

| | | | | |
|---|---|---|---|---|
| 5,506,686 A | * | 4/1996 | Auyeung et al. | 358/426.03 |
| 5,648,774 A | | 7/1997 | Hsieh | 341/67 |
| 5,724,451 A | | 3/1998 | Shin et al. | 382/240 |
| 5,835,034 A | * | 11/1998 | Seroussi et al. | 341/65 |
| 5,838,691 A | * | 11/1998 | Chu et al. | 714/704 |
| 5,929,914 A | | 7/1999 | Normand | 348/405 |
| 5,949,490 A | | 9/1999 | Borgwardt et al. | 348/419 |
| 5,978,029 A | | 11/1999 | Boice et al. | 348/412 |
| 6,097,757 A | | 8/2000 | Boice et al. | 375/240 |
| 6,141,449 A | | 10/2000 | Kawada et al. | 382/236 |

OTHER PUBLICATIONS

"Highly Parallel, Flexible Half Pel and Dual Prime Motion Estimation System"; IBM Technical Disclosure Bulletin, vol. 39 No. 12, Dec. 1996, pp. 161–166.

"Sub-Band Coding Hardware Assist"; IBM Technical Disclosure Bulletin, vol. 34 No. 7B, Dec. 1991, pp. 194–198.

* cited by examiner

*Primary Examiner*—Jean Bruner Jeanglaude
(74) *Attorney, Agent, or Firm*—Whitham, Curtis & Christofferson, P.C.; William H. Steinberg

(57) ABSTRACT

Two encoders are used in cascade wherein one encoder functions as a preprocessor for the other by collecting statistics concerning partially processed input data. The statistics thus derived are autonomously transferred to a second decoder in a self-synchronized manner, avoiding any need for external glue logic, and utilized to select encoding options for encoding and/or compressing the data so that the quality of encoded data is optimized based on the content of current input data.

16 Claims, 2 Drawing Sheets

APPARATUS FOR INTEGRATED CASCADE ENCODING

BACKGROUND OF THE INVENTION

1. Field of the Invention

The present invention generally relates to digital encoding of images and, more particularly, to encoding, with compression, of sequences of images to be reproduced in rapid succession to produce the illusion of motion, such as for digital transmission of motion pictures or animated graphics.

2. Description of the Prior Art

For purposes of communication, digital signalling is currently much preferred to analog signalling in most environments and applications. Consequently, communications infrastructure is rapidly being converted to carry digital signals. Reasons supporting such a strong preference are much increased bandwidth and transmission capacity, decreased susceptibility to noise and the possibility of strong error correction to compensate for transmission losses. Accordingly, it is now possible to transmit relatively massive amounts of data economically and in short periods of time.

One such application which is rapidly becoming familiar and a source of substantial economic interest is the digital transmission of pictorial images and graphics. In particular, the transmission of images at high data rates sufficient to achieve the illusion of motion such as is encountered in animated graphics and motion pictures is now commercially feasible and coming into relatively widespread use. However, to do so, a sequence of images must be presented at rates above the so-called flicker fusion frequency of human visual perception, generally accepted as being about twenty-four to thirty images per second.

Further, digital image data must contain a very large amount of information to achieve good image quality and fidelity. The amount of data in a single image may contain several million image points or "pixels", each of which must be encoded to represent fine gradations of both color and intensity. Thus it can be seen that even a single, very short sequence of digitized motion picture could require the equivalent of billions of bytes of data to be transmitted and/or stored.

In order to accommodate such massive amounts of information with commercially available and sufficiently inexpensive hardware to be used by persons desiring such information or the general public at large and to efficiently and economically utilize the communication infrastructure, it is necessary to reduce the volume of data by compression. Several standards for image data compression have been proposed and widely adopted. Among the more well-accepted standards for compression of image data are the JPEG (Joint Photographic Experts Group) standard and the MPEG (Motion Picture Experts Group) standard, both of which are known in several versions at the present time.

The JPEG standard allows optimal resolution and fidelity to be maintained for any arbitrary degree of data compression and compression by a factor of twenty or more often does not result in loss of image quality or fidelity which is generally perceptible. The MPEG standard is similar to the JPEG standard in many aspects but also allows redundancy of portions of the image from frame to frame to be exploited for additional data compression. This process is enhanced by different encoding and decoding techniques being applied for independent frames (I-frames) which are compressed independently of data in other temporally proximate frames, interpolated frames (P-frames) compressed in terms of changes from a preceding I or P frame and frames which are bidirectionally interpolated (B-frames) between preceding and following I or P frames.

The high degree of compression with minimal loss of fidelity is enhanced in accordance with these and other standards by providing flexibility of coding in dependence upon image content. A powerful concept in this process is entropy coding; so-called because, in a manner somewhat parallel to the concept of entropy in the more familiar thermodynamic context, it represents a measure of the disorder within the image as a metric for assignment of particular codes to particular image values on the well-founded assumption that less common values contain greater amounts of information justifying greater numbers of bits and that more common image values contain relatively less information and can (and should) be represented by smaller numbers of bits in the coded data. However, to determine how image data values in a given image (or portion thereof since coding tables can be changed within an image) are encoded, it is necessary to accumulate statistics concerning the image values in an image before code values can be analyzed and efficient code assigned to respective values. In other words, a substantial portion of the encoding process must be completed and the results analyzed before it can be known which codes can be most efficiently assigned to image values representing regions within the image.

(As a matter of terminology, it will be understood by those skilled in the art that "pixel values" such as luminance and chrominance of the individual pixels of the image are transformed in groups, called macroblocks, by an orthogonal transform process such as a discrete cosine transformation to yield values which represent the image in terms of spatial frequency and which are referred to herein as "image values". This processing has the effect of providing image values which may have a reduced number of significant bits and which may often be reduced or zero bits removed by truncation without perceptible reduction in image fidelity since human visual perception is relatively less sensitive to high spatial frequencies. At the same time, image values representing low spatial frequency, to which the human eye is also somewhat insensitive, may be more common but represented by fewer bits through entropy encoding. However, the particular preprocessing is not important beyond the fact that substantial preprocessing must be performed and the results analyzed before the details of a relatively optimal encoding process can be determined.)

In the past, it has been the practice to perform encoding in a pipelined fashion with each discrete processing step being performed on the results of a preceding step. However, this approach may require a process to be performed for an entire frame before a following process can be started and thus introduces latency in the data which may cause synchronization problems. Encoders adequate for television data rates (which are of lower resolution than may be desired) and using pipelined architectures have been developed and are currently available but exhibit such latency and may cause such synchronization problems, particularly where the encoding requires extra bits to be used or quantization table(s) to be changed; both of which increase the number of bits which must be transmitted. However, conditions such as extra bits and frequent changes of quantization tables are more likely to occur when increased image quality, fidelity and/or resolution is required.

Preprocessing of the image values is thus often used to predict encoding options for optimized picture quality. Since encoder output provides the most accurate information concerning the image content, encoders can be used as preprocessors. Cascade encoding using a plurality of encoders in stages has been used to improve picture quality. The silicon/chip size, circuit power and evenness of picture quality depends oh the amount of information and output statistics that are provided to the second encoding stage and, in such an environment, first stage encoder/preprocessor statistics must be extracted and collected from the first stage encoder and then converted to the host interface data format and fed to the second stage encoder. Such a system is often referred to as a two-pass system and supports use of image value statistics for choice of encoding options on the same frame (as distinct from a so-called one-pass system which uses statistics from one frame for coding of a following frame for which they may not be optimal or even appropriate and which thus cannot optimize encoding of any frame or field based on the actual content of that frame or field).

However, these pipelined and data transfer processes require extensive support in both hardware and processing, particularly for synchronization of data transfer and encoder functions and buffering, and, hence, increase circuit complexity and, generally, image data latency even though some hardware economies may be realized in regard to the encoders themselves since commercially available encoders may be used. This additional, multiple function overhead to coordinate multiple encoder pipelines and data transfer functions is often comprehensively referred to as "external glue logic" and which may be quite extensive and may significantly increase data latency as well as overall encoder complexity and cost. There has been no alternative to pipelining and the preprocessing, latency and extensive external glue logic that pipelining implies when supporting optimal choice of encoding options based on image content in a twopass encoder arrangement.

SUMMARY OF THE INVENTION

It is therefore an object of the present invention to provide a simple, compact and economical encoding and/or data compression system having low, programmable latency and the capacity to support prediction of coding options for optimized decoded data (or image) quality or fidelity with reduced synchronization processing overhead.

It is another object of the invention to provide an encoding system utilizing an encoder for data pre-processing and control of another encoder, particularly for image data with simplified control of data transfer without external glue logic.

It is a further object of the invention to effectively provide a two-pass system for optimal encoding and/or compression of each frame of image data in substantially real-time in a simplified manner with reduced processing and hardware support.

In order to accomplish these and other objects of the invention, an encoding system is provided including a first encoder functioning as a preprocessor for collection of statistics concerning input data, a second encoder for receiving the collected statistics concerning input data, selecting between encoding options responsive to the statistics and encoding data in accordance with the selected options, and an arrangement for autonomusly transferring the statistics from the first encoder to the second encoder whereby encoding is optimized for current input data without external glue logic.

In accordance with another aspect of the invention, a data encoding/compression method is provided comprising steps of providing input data in parallel to a plurality of encoders, partially processing the input data to derive partially processed data, collecting statistics concerning the partially processed data in a first encoder, autonomously transferring the statistics to a second encoder, and further processing the partially processed data in accordance with the statistics.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
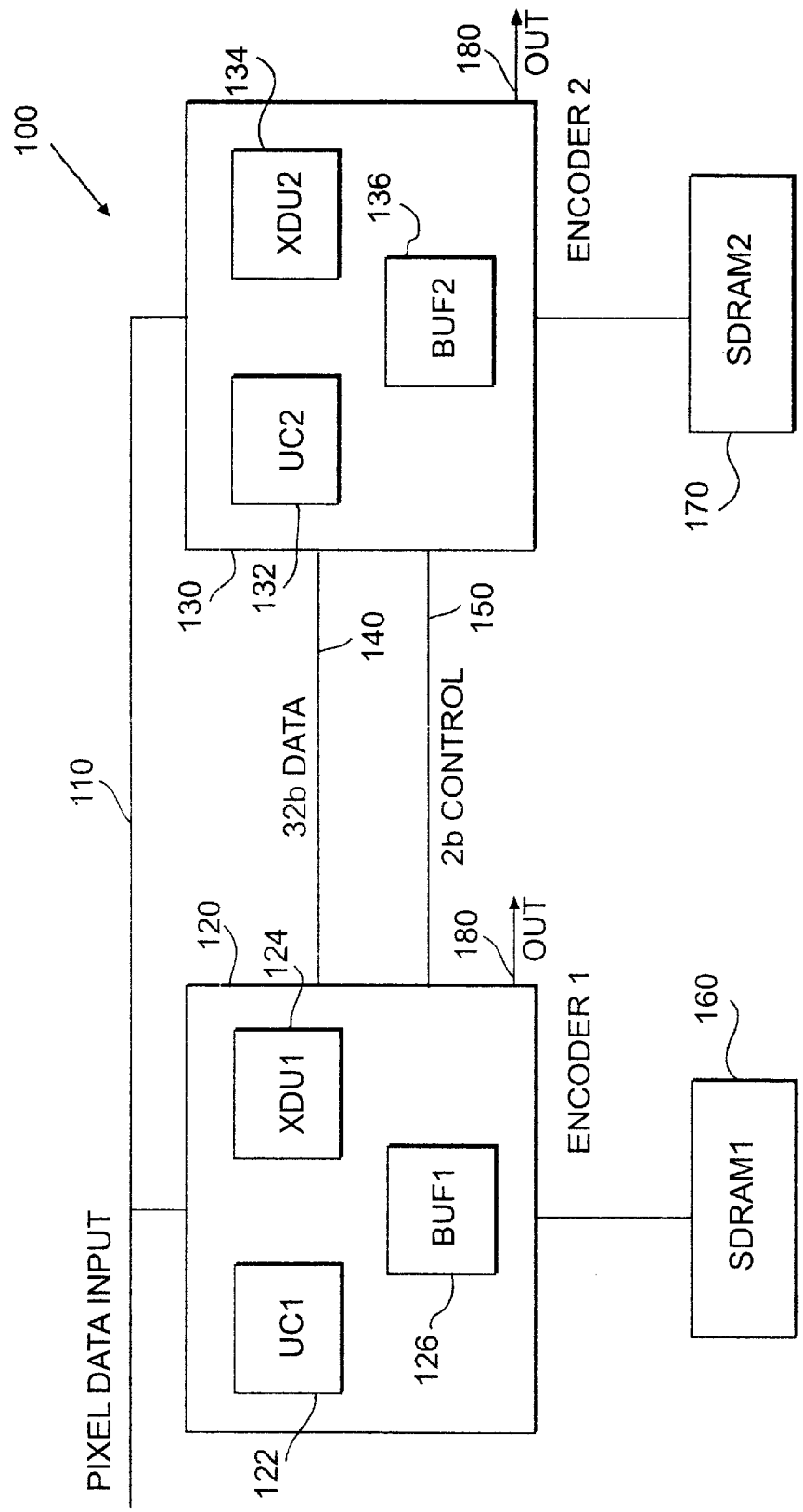
FIG. 1 is a schematic block diagram of encoder system architecture in accordance with the invention.

Referring now to the drawings, and more particularly to FIG. 1, there is shown a schematic block diagram of the architecture of an encoder system 100 in accordance with the invention and, in accordance with a preferred form and application of the invention, adapted for encoding of image data. However, it is to be understood that the invention can be applied to any type of data and any encoding environment where encoding and/or compression options may be chosen to provide improved quality of the data either in the encoded form or as later decoded.

The encoder system 100 provides input data 110 in parallel and simultaneously to two encoders 120 and 130. For purposes of this discussion, it will be assumed that encoder 120 will be a primary or first stage encoder and function as a pre-processor while encoder 130 will be a secondary or second stage encoder that develops the encoded data ultimately output or stored. (This nomenclature reflects that the second stage/secondary encoder 130 receives data from the first stage/primary encoder even though encoder 130 operates one the same input data as encoder 120.) However, since the encoders 120, 130 (and their support memories 160, 170) are preferably identical, it is immaterial to the practice of the invention which encoder is used as the primary or secondary encoder and it may be advantageous in some circumstances to switch the respective functions between encoders, as is clearly possible for practice of the invention. However encoders 120 and 130 are respectively employed, data is supplied to both, preferably simultaneously/synchronously and in parallel, and both the data/image content and the primary encoder output are used to assist and optimize the second stage encoding.

As a general overview of the invention, since the (image/pixel) data is delivered to both the first and second stage encoders, the picture content can be calculated by both encoders. Output statistics of the primary or first encoder can be used to refine and optimize the encoding process of the second or secondary encoder and is preferably transferred from the first encoder by a cross-data (XD) or cross-chip interface, configured and depicted as a data bus 140, preferably thirty-two bits wide, with a two:bit control bus or connection 150. Each encoder 120, 130 is preferably provided with an external support memory. 160, 170, respectively. For maximum flexibility, the operation is preferably initiated and directed by chip microcode UC1 122, UC2 132 and thus can be performed autonomously and without external synchronization. Hence, the data transfer between interface units 124, 134 is essentially self-synchronized and may flexibly overlap with the picture encoding process. Further, the statistics may be transferred on a macroblock basis, a group of pictures (GOP) basis or any division of data therebetween. Thus the use of increased number of bits, alteration of quantization or shifting of allocation of bits between pictures (e.g. from B-frames to I or P frames) may be performed at will to enhance the quality of encoding.

With more specific reference to FIG. 1, since the encoding process of stage one may not temporally align with the encoding of stage two, interface buffers 126, 136 are preferably provided in encoders 120, 130, respectively to minimize the performance impact of any misalignment that may occur. For macroblock statistics transfer, at the completion of an initial encoding process for each macroblock (which may be of arbitrary size) of image data, output statistics are collected by primary encoder 120 and written to a predetermined location in its external support memory (e.g. SDRAM1 160). Upon completion, a transfer command is issued by microcode 122 and executed by the XD interface unit XDU1 124, which fetches the macroblock statistics from SDRAM1 160 and temporarily stores it in interface buffer buf1 126 and a write request is sent to the second encoder 130, preferably over one of the control connections 150. (A two-bit control is preferred and preferably comprises a request signal and an acknowledge signal, preferably on separate connections or links.) XDU1 124 then waits until an acknowledgment is received from XDU2 134, preferably over the second of the control connections 150, whereupon the statistics data is transferred to encoder 130.

In the preferred architecture illustrated, the thirty-two bit data bus 140 is used to transfer statistics identification (ID), statistics length and the statistics data. Preferably prior to the end of the same encoding process for the same macroblock in encoder 130 (but without the necessity of collecting image data statistics), its microcode UC2 132 issues a store request to its XD interface unit XDU2 132 which acknowledges the prior write request from XDU1 124, alluded to above and the statistics transfer between the two encoders begins. The statistics data to be transferred is preferably arranged into blocks, preferably of one hundred twenty-eight bytes per block. When XDU1 starts transfer of a block of data, XDU2 starts an external memory,store operation to a predefined location in SDRAM2 170. This process is repeated until statistics for all macroblocks have been transferred.

Further encoding processes are potentially delayed in the secondary encoder 130 until picture and macroblock statistics are available from primary encoder 120, as indicated by the write request described above, but further encoding can begin upon storage of statistics for a macroblock in external memory 170 under autonomous control of of the second stage processor such that the second stage processor can obtain the statistics data as soon as (or even somewhat before) it can be utilized; reducing latency and simplifying synchronization.

While the categories or types of statistics data used are not particularly important to the practice of the invention in accordance with its basic principles and can be changed at will to accommodate optimal encoding compression, preferred examples of macroblock statistics which may be used in the practice of the invention are macroblock quantization value and macroblock bits used. Macroblock complexity can be determined from these two statistics. The relationship between the complexity of the current macroblock and average macroblock complexity of the picture can be used to refine the macroblock bit budget and improve picture quality through choice of encoding options.

The reduced latency between the first stage encoder and the second stage encoder is nevertheless sufficient to provide look-ahead statistics for the second stage encoder. Usually, better look-ahead information allows better encoding decisions for the current picture. This latency becomes programmable and is changeable on a picture, group of pictures (GOP) or sequence boundary. Thus, while the direct reduction in actual latency during encoding is largely a function of an increase of speed of statistics calculation which may be accumulated at increased speed in the first stage encoder (as opposed to being calculated after completion of initial processing using a single encoder) the latency is programmable and thus reduces processing overhead for synchronization in real-time applications such as broadcast image transmissions.

Figure 2:
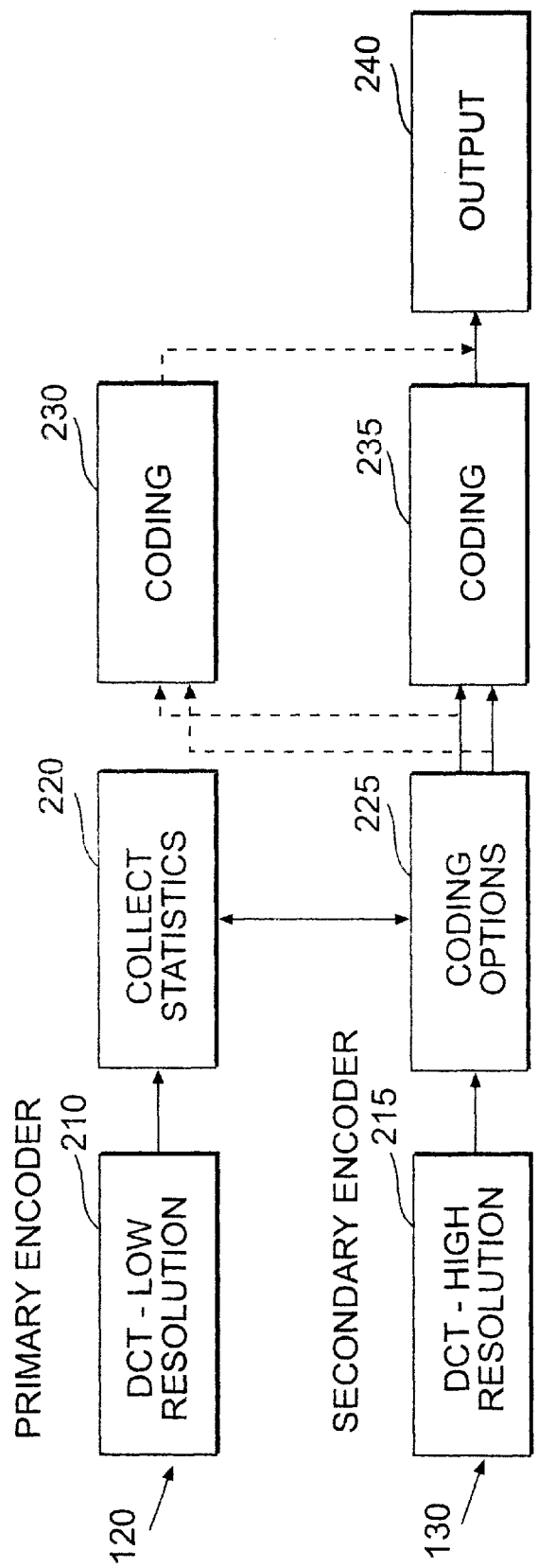
FIG. 2 illustrates pipelined data flow through the cascaded encoders in accordance with the invention.

More specifically, the cascaded operation of the two encoders (or groups of encoders articulated in a similar fashion to process, for example, different portions of an image or macroblock) in accordance with the invention may be better understood from FIG. 2. The primary encoder 120 and secondary encoder 130 operate substantially in parallel but are effectively pipelined with each other to some extent while each encoder, individually, may be conceptualized as a pipelined arrangement. As alluded to above, both encoders 120, 130 receive data concurrently in parallel and both perform initial encoding processes such as discrete cosine transformation (DCT) in parallel but autonomously. Therefore, for example, the resolution or number of significant digits in the transformation or other initial processes need not be the same and some loss of data or resolution may be tolerable in the primary encoding channel in order to accelerate the process.

In any case, in a single encoder arrangement, the initial processing must be completed before the calculation of statistics can be started and a significant decrease of latency can be achieved if the statistics can be accumulated in a shorter time in the primary encoder than a single encoder can serially perform both processes. Thus, it is expected that the statistics information will be available from processing 210 and collection 220 at the time or only shortly after the initial stage processing 215 is completed in the secondary encoder; essentially removing the statistics calculation from the pipeline of the secondary processor and allowing it to proceed directly to choice of coding options 225 using statistics from the same image frame or field (whereas, in some arrangements such as single pass encoder systems, the statistics may not be available to be used until a following image frame or field). Once the coding options are chosen to optimize compression consistent with image quality, the final encoding 235 can be performed, possibly supplemented by otherwise unused processing capacity 230 in the primary encoder, as illustrated by dashed lines in FIG. 2.

In view of the foregoing, it is seen that the cascaded encoder architecture in accordance with the invention provides a simple, compact and economical encoding system using available encoders, one of which functions as a preprocessor for the other, thus achieving reduced and programmable latency and supporting enhanced encoded (and decoded) data quality, particularly for image data and reduced synchronization processing overhead. It is also seen that the invention effectively provides a two-pass system for optimal encoding in substantially real-time. The encoders operate autonomously and asynchronously for flexibility of encoding and minimization of impact on performance of temporal non-alignment of processing in the respective encoders. Transfer of data between the encoders is performed autonomously in a self-synchronized manner without external glue logic to improve performance, reduce data latency and more fully exploit possible economies of encoder design.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An encoding system including
   a first encoder functioning as a preprocessor for collection of statistics concerning input data,
   a second encoder for receiving said statistics concerning input data, said second encoder including means responsive to said statistics for selecting between encoding options, and
   means for autonomously transferring said statistics from said first encoder to said second encoder
   whereby encoding in said second encoder is optimized for current input data without external glue logic.

2. An encoding system as recited in claim 1, further including
   an external support memory associated with at least said first encoder.

3. An encoding system as recited in claim 1, wherein said means for transferring is performed responsive to a write request from said first encoder and an acknowledgment from said second encoder.

4. An encoder system as recited in claim 3, wherein said means for transferring said statistics is a cross-data interface.

5. An encoder system as recited in claim 3, further including
   control connections for controlling said means for transferring said statistics.

6. An encoder system as recited in claim 3, wherein said first encoder and said second encoder operate autonomously in response to microcode.

7. An encoder system as recited in claim 6, wherein said microcode controls said means for transferring said statistics.

8. An encoder system as recited in claim 1, further including a buffer in at least said first encoder for storing said statistics for transfer to said second encoder.

9. A data encoding/compression method comprising steps of
   providing input data in parallel to a plurality of encoders,
   partially processing said input data in said plurality of encoders to derive partially processed data,
   collecting statistics concerning said partially processed data in a first encoder of said plurality of encoders,
   autonomously transferring said statistics to a second encoder of said plurality of encoders, and
   further processing said partially processed data in said second encoder in accordance with said statistics.

10. A method as recited in claim 9, including the further step of
    selecting coding options in said second processor in accordance with said statistics.

11. A method as recited in claim 9, including the further step of
    storing said statistics in a support memory of said first processor.

12. A method as recited in claim 11, including the further step of
    storing said statistics in a support memory of said second encoder responsive to said transferring step.

13. A method as recited in claim 11, including the further step of
    sending a write request from said first encoder to said second encoder following said step of storing said statistics in said support memory of said first encoder.

14. A method as recited in claim 13, wherein said transferring step is performed in response to an acknowledgement of said write request.

15. A method as recited in claim 9 wherein said statistics include macroblock complexity and macroblock bits used.

16. A method as recited in claim 15 wherein said statistics include identification data.

* * * * *